United States Patent [19]
Wasada

[11] Patent Number: 5,970,075
[45] Date of Patent: Oct. 19, 1999

[54] METHOD AND APPARATUS FOR GENERATING AN ERROR LOCATION POLYNOMIAL TABLE

[75] Inventor: Langford M. Wasada, San Diego, Calif.

[73] Assignee: Uniden San Diego Research and Development Center Inc., Calif.

[21] Appl. No.: 08/878,060

[22] Filed: Jun. 18, 1997

[51] Int. Cl.$^6$ .................................................. H03M 13/00
[52] U.S. Cl. ..................... 371/37.11; 371/37.4; 371/37.5; 371/37.8; 375/200; 375/232
[58] Field of Search ...................... 371/37.1, 5.1, 371/37.7, 37.4, 37.6, 37.8, 37.08, 37.12, 37.07, 37.11, 2.1, 37.5; 375/232, 350, 200

[56] References Cited

U.S. PATENT DOCUMENTS

| | | | |
|---|---|---|---|
| 4,584,686 | 4/1986 | Fritze | 371/37 |
| 4,644,543 | 2/1987 | Davis, Jr. | 371/37 |
| 4,833,678 | 5/1989 | Cohen | 371/37 |
| 4,843,607 | 6/1989 | Tong | 371/37 |
| 4,873,688 | 10/1989 | Maki et al. | 371/37.1 |
| 4,958,349 | 9/1990 | Tanner et al. | 371/37.1 |
| 5,040,179 | 8/1991 | Chen | 371/37.1 |
| 5,068,857 | 11/1991 | Yoshida | 371/37.7 |
| 5,396,502 | 3/1995 | Owsley et al. | 371/37.1 |
| 5,532,693 | 7/1996 | Winters et al. | 341/51 |
| 5,708,665 | 1/1998 | Luthi et al. | 371/5.1 |

OTHER PUBLICATIONS

Lin et al., *Error Control Coding, Fundamentals and Applications*, pp. 33, 145–146, 155–157, 159–160, 170–176 (Prentice–Hall, 1983).

*Primary Examiner*—Reba I. Elmore
*Assistant Examiner*—McDieunel Marc
*Attorney, Agent, or Firm*—Heller Ehrman White & McAuliffe

[57] ABSTRACT

A method and apparatus which corrects errors in a receive vector and a receiver. An essentially conventional method and apparatus are used to produce a polynomial representation of the receive vector, syndromes associated with the receive vector, and a Galios Field table. An inventive method and apparatus is used to generate an error location polynomial table and thus an error location polynomial which can then be used to locate and correct a maximum number of errors in the receive vector. The inventive method includes comparing previously generated entities in an error location polynomial table to one another to determine which of the previously generated entries should be used in generating a next entry to the error location polynomial table.

13 Claims, 5 Drawing Sheets

METHOD AND APPARATUS FOR GENERATING AN ERROR LOCATION POLYNOMIAL TABLE

BACKGROUND OF THE INVENTION

1. Field of the Invention

This invention relates to method and apparatus for generating an error correction code for correcting errors in data, and more particularly, a method and apparatus for generating an error location polynomial table used to locate errors in data which has been encoded using a Reed-Solomon error correction technique.

2. Description of Related Art

Data which is either stored or communicated is susceptible to errors. Errors corrupt the value of the data and thereby obscure the original value. Therefore, in situations in which the exact value of data is required to be reliably determined, a means must be provided by which the original value of the data can be determined after the data has been read from a storage device or after received by a device at the receiving end of a communication path.

One means for determining the original value of data which has been corrupted is commonly referred to as Reed-Solomon error detection and correction. Reed-Solomon error detection and correction requires that the data initially be encoded. Data is grouped into information symbols which form Reed-Solomon blocks. The universe of all possible symbols is referred to as the "finite field". For example, forward error correction (FEC) used in Cellular Digital Packet Data (CDPD) is performed by transmitting information encoded in Reed-Solomon blocks comprising 47 information symbols of 6 bits each followed by 16 parity symbols of 6 bits each.

In accordance with Reed-Solomon encoding, the finite field is "closed", meaning that the product or sum of any two symbols within the finite field is another symbol within the finite field. Reed-Solomon encoding schemes are characterized by the total number of symbols n in an RS block, where $n=2^m-1$ and m is the number of bits in each symbol, and the total number of information symbols in each block is k. A Reed-Solomon code is typically referred to as RS(n, k). Accordingly, a Reed-Solomon code in which symbols have 6 bits, and thus a total number of symbols in a block is equal to 63, and a total number of information symbols in each block is equal to 47 is referred to as RS(63, 47). It is well known in the art that the number of errors that can theoretically be corrected in a RS(n, k) encoding is $(n-k)/2=t$. Accordingly, 8 errors can theoretically be corrected using an RS(63, 47) code having 2t=16 additional (i.e., "parity") symbols in each block of 63.

Once the information has been mapped into a transmit vector and the transmit vector has been either stored or transmitted, errors which occur in the transmit vector can be detected and corrected by generating an error location polynomial $\sigma(X)$. The value of the error location polynomial is determined by one of several well known algorithms. One of these algorithms is known as "Berlekamp's iterative algorithm".

In accordance with Berlekamp's iterative algorithm the first step is to find a first minimum-degree polynomial $\sigma^{(1)}(X)$ whose coefficients satisfy a first Newton's identity. It should be noted that the superscript "(1)" indicates that this is the first minimum degree polynomial, as opposed to the second, third polynomial, etc., as will become apparent below. Details regarding the nature of the Newton's identity are provided in Error Control Coding: Fundamentals and Applications, by Shu Lin and Daniel J. Costello, Jr. (Prentice-Hall, 1983) which is herein incorporated by reference. Lin and Costello disclose a method for generating the values $\sigma^{(\mu)}(X)$ by generating a series of "syndrome" components using a well known algorithm. The syndrome components are then used to generate "discrepancies", $d_\mu$. If $d_\mu=0$, then the coefficients of $\sigma^{(\mu)}(X)$ satisfy the $(\mu+1)^{th}$ Newton's identity. Therefore:

$$\sigma^{(\mu-1)}(X)=\sigma^{(\mu)}$$

The next step is to test whether the coefficients of $\sigma^{(1)}(X)$ satisfy a second Newton's identity. If the coefficients of $\sigma^{(1)}(X)$ satisfy the second Newton's identity (i.e., $d^1=0$), then the value of a second minimum-degree polynomial $\sigma^{(2)}(X)$ is equal to the value of the first minimum-degree polynomial $\sigma^{(1)}(X)$. However, if the second Newton's identity is not satisfied by the first minimum-degree polynomial $\sigma^{(1)}(X)$ (i.e., $d^1$ not equal to 0), then a correction term is added to $\sigma^{(1)}(X)$ to form $\sigma^{(2)}(X)$, such that $\sigma^{(2)}(X)$ has minimum degree and its coefficients satisfy the first two Newton's identities. Therefore, at the end of the second step of iteration, a minimum-degree polynomial $\sigma^{(2)}(X)$ has been obtained whose coefficients satisfy the first two Newton's identities. The third step is to find a minimum-degree polynomial $\sigma^{(3)}(X)$ from $\sigma^{(2)}(X)$, such that the coefficients of $\sigma^{(3)}(X)$ satisfy the third Newton's identity. If the coefficients of $\sigma^{(2)}(X)$ satisfy the first three Newton's identities (i.e., $d^2=0$), then $\rho^{(3)}(X)=\sigma^{(2)}(X)$. If not, then a correction term is added to $\sigma^{(2)}(X)$ to form $\sigma^{(3)}(X)$. Iterations continue until each minimum-degree polynomial through $\sigma^{(2t)}(X)$ has been generated. The polynomial $\sigma^{(2t)}(X)$ is equal to the error location polynomial $\sigma(X)$. The error location polynomial $\sigma(X)$ yields an error pattern $e(X)$ which can be used to determine the location of the errors in a received polynomial $r(X)$, if the number of errors in the received polynomial is no greater then t.

The syndrome components are generated using a well known algorithm disclosed by Lin and Costello. The syndrome components are then used to generate the discrepancies, $d_\mu$.

If $d_\mu$ is not equal to zero, (i.e., the coefficients of $\sigma^{(\mu)}(X)$ do not satisfy the $(\mu+1)^{th}$ Newton's identity) then a correction term must be added to $\sigma^{(\mu)}(X)$ to obtain $\sigma^{(\mu+1)}(X)$. To determine the value of this correction term, each previously generated polynomial $\sigma^{(\mu)}(X)$ must be analyzed to determine which polynomial $\sigma^{(\rho)}(X)$ has the largest degree (i.e., the greatest exponent of X) and has a corresponding $\sigma^{th}$ discrepancy $d_\rho$ not equal to zero. The value $\rho$ identifies a previously completed row of values within the error location polynomial table.

One way to organize this process is to generate an error location polynomial table, such as Table 1, in which for each value of $\mu$ there is an associated minimum-degree polynomial $\sigma^{(\mu)}(X)$, a $\mu^{th}$ discrepancy $d_\mu$, a value $1_\mu$ equal to the degree of the polynomial $\sigma^{(\mu)}(X)$, and a value $\mu-1_\mu$.

TABLE 1

| $\mu$ | $\sigma^{(\mu)}(X)$ | $d_\mu$ | $1_\mu$ | $\mu - 1_\mu$ |
|---|---|---|---|---|
| −1 | 1 | 1 | 0 | −1 |
| 0 | 1 | $\alpha^{12}$ | 0 | 0 |
| 1 | $1 + \alpha^{12}X$ | $\alpha^7$ | 1 | 0 (take $\rho = -1$) |
| 2 | $1 + \alpha^3 X$ | 1 | 1 | 1 (take $\rho = 0$) |
| 3 | $1 + \alpha^3 X + \alpha^3 X^2$ | $\alpha^7$ | 2 | 1 (take $\rho = 0$) |

TABLE 1-continued

| $\mu$ | $\sigma^{(\mu)}(X)$ | $d_\mu$ | $l_\mu$ | $\mu - l_\mu$ |
|---|---|---|---|---|
| 4 | $1 + \alpha^4 X + \alpha^{12} X^2$ | $\alpha^{10}$ | 2 | 2 (take $\rho = 2$) |
| 5 | $1 + \alpha^7 X + \alpha^4 X^2 + \alpha^6 X^3$ | 0 | 3 | 2 (take $\rho = 3$) |
| 6 | $1 + \alpha^7 X + \alpha^4 X^2 + \alpha^6 X^3$ | — | — | — |

The is generated by initializing the table with the values of the first two rows, as shown in Table 2.

TABLE 2

| $\mu$ | $\sigma^{(\mu)}(X)$ | $d_\mu$ | $l_\mu$ | $\mu - l_\mu$ |
|---|---|---|---|---|
| $-1$ | 1 | 1 | 0 | $-1$ |
| 0 | 1 | $S_1$ | 0 | 0 |
| 1 | | | | |
| 2 | | | | |
| 3 | | | | |
| 4 | | | | |
| 5 | | | | |
| 6 | | | | |

The values of Table 1 have been determined by assuming a triple-error correcting Reed-Solomon code RS(15, 9) with symbols from the Galios Field $GF(2^4)$. In addition, it is assumed that an all zeros vector is transmitted and a vector $r=(0\ 0\ 0\ \alpha^7\ 0\ 0\ \alpha^3\ 0\ 0\ 0\ 0\ 0\ \alpha^4\ 0\ 0)$ is received having three errors. It should be noted that while there are considered to be only three errors, each of the three errors represents a change of state of more than one bit within the receive vector. For example, the 4-tuple representation of $\alpha^7$ is 1101. Therefore, three bits have changed state between transmission and reception, resulting in one errored symbol.

The polynomial representation of the receive vector is $r(X)=\alpha^7 X^3+\alpha^3 X^6+\alpha^4 X^{12}$. The polynomial representation of the receive vector is formed as a sum of products of each power representation and X raised to a power, the power to which X is raised being equal to the location of the power representation within the receive polynomial. In the present example, the first product is $\alpha^7 X^3$ because the sum of the first three products are each equal to zero (i.e., $0 \cdot 1+0 \cdot X+0 \cdot X^2=0$). In the present case, since all zeros were transmitted, the polynomial $r(X)$ has only three components, each of which represent an erroneous symbol and its location. Syndrome components are created from the polynomial $r(X)$ as follows:

$$S_1=r(\alpha)=\alpha^{10}+\alpha^9+\alpha=\alpha^{12} \quad \text{(EQ. 2)}$$

$$S_2=r(\alpha^2)=\alpha^{13}+1+\alpha^{13}=1 \quad \text{(EQ. 3)}$$

$$S_3=r(\alpha^3)=\alpha+\alpha^6+\alpha^{10}=\alpha^{14} \quad \text{(EQ. 4)}$$

$$S_4=r(\alpha^4)=\alpha^4+\alpha^{12}+\alpha^7=\alpha^{10} \quad \text{(EQ. 5)}$$

$$S_5=r(\alpha^5)=\alpha^7+\alpha^3+\alpha^4=0 \quad \text{(EQ. 6)}$$

$$S_6=r(\alpha^6)=\alpha^{10}+\alpha^9+\alpha=\alpha^{12} \quad \text{(EQ. 7)}$$

It should be noted that multiplication of a base raised to a power (commonly referred to as a power representation) by a second power representation in a Galios Field is performed by adding the exponents of like bases using modulo n addition, where n is the size of the entire Galios Field (in this case, 16) (e.g., $\alpha^7 \alpha^3=\alpha^{10}$). Furthermore, addition of a first power representation to a second power representation in a Galios Field is performed by looking up the n-tuple representation associated with each power representation and exclusive ORing the n-tuple representations (e.g., $\alpha^7+\alpha^3=\alpha^4$; where the 4-tuple representation of $\alpha^7=1101$, the 4-tuple representation of $\alpha^3=0001$, (1101 XOR 0001)=1100, and the power representation of $1100=\alpha^4$). Table 3 provides the power representation and associated 4-tuple representations for each symbol in a Galios Field $GF(2^4)$.

TABLE 3

| Power Representation | 4-Tuple Representation |
|---|---|
| 0 | 0 0 0 0 |
| 1 | 1 0 0 0 |
| $\alpha^1$ | 0 1 0 0 |
| $\alpha^2$ | 0 0 1 0 |
| $\alpha^3$ | 0 0 0 1 |
| $\alpha^4$ | 1 1 0 0 |
| $\alpha^5$ | 0 1 1 0 |
| $\alpha^6$ | 0 0 1 1 |
| $\alpha^7$ | 1 1 0 1 |
| $\alpha^8$ | 1 0 1 0 |
| $\alpha^9$ | 0 1 0 1 |
| $\alpha^{10}$ | 1 1 1 0 |
| $\alpha^{11}$ | 0 1 1 1 |
| $\alpha^{12}$ | 1 1 1 1 |
| $\alpha^{13}$ | 1 0 1 1 |
| $\alpha^{14}$ | 1 0 0 1 |

The syndrome components are then used to calculate discrepancy components $d_\mu$. As can be seen from Table 2, $d_{-1}$ is always equal to 1 and $d_0$ is always equal to $S_1$. In the present example, $d_0=S_1=\alpha^{12}$. Generation of the discrepancy components will be discussed below.

In generating the values of Table 1 according to the Berlekamp iterative algorithm, the next step is to determine the value of $\sigma^2(X)$. The value of $\sigma^{(\mu+1)}(X)$ is calculated by applying the formula:

$$\sigma^{(\mu+1)}(X)=\sigma^{(\mu)}(X)+(d_\mu/d_\rho) \cdot X^{(\mu-\rho)} \cdot \sigma^{(\mu)}(X) \quad \text{(EQ. 8)}$$

where $\rho$ identifies a previously completed row of values within the error location polynomial table. However, it can be seen that if $d_\mu$ is equal to zero, then:

$$\sigma^{(\mu+1)}(X)=\sigma^{(\mu)}(X) \quad \text{(EQ. 9)}$$

The value of $\rho$ is determined by selecting a row which has been completed prior to the $\mu^{th}$ row, which has both a discrepancy $d_\rho$ which is non-zero, and for which the value of $\mu-l_\mu$ in the last column (i.e., the right-most column) in the row is greatest in relation to the values in the last column in each other row which was completed prior to the $\mu^{th}$ row and which has a non-zero discrepancy.

To calculate the value $\sigma^{(\mu+1)}(X)=\sigma^{(1)}(X)$ it should be noted that $\mu+1=1$. Therefore $\mu=0$, $d_\mu=d_0=S_1=\alpha^{12}$, and $\sigma^{(0)}(X)=1$. Furthermore, since only the row in which the value in the first column is equal to $-1$ was completed prior to the $\mu^{th}$ row and has a discrepancy that is not equal to zero, $\rho$ should be set equal to $-1$.

By setting $\rho=-1$, the values of $d_\rho$ and $X^{(\mu-\rho)}$ can be determined. The value of $d_\rho=d_{-1}=1$. The value of $X^{(\mu-\rho)}=X^{(0-(-1))}=X$. Therefore, the value of $\sigma^{(1)}(X)$ can be determined by applying equation EQ. 8 as follows:

$$\sigma^{(\mu+1)}(X) = \sigma^{(\mu)}(X) + (d_\mu/d_\rho) \cdot X^{(\mu-\rho)} \cdot \sigma^{(\mu)}(X) \quad \text{(EQ. 10)}$$

$$= \sigma^{(0)}(X) + (d_0/d_{-1}) \cdot X^{(0-(-1))} \cdot \sigma^{(0)}(X)$$

-continued $$= 1 + (\alpha^{12}/1) \cdot X \cdot 1$$

$$= \sigma^{(1)}(X)$$

$$= 1 + \alpha^{12} X$$

This value is then inserted into Table 2, as shown in Table 4.

TABLE 4

| $\mu$ | $\sigma^{(\mu)}(X)$ | $d_\mu$ | $l_\mu$ | $\mu - l_\mu$ |
|---|---|---|---|---|
| −1 | 1 | 1 | 0 | −1 |
| 0 | 1 | $S_1$ | 0 | 0 |
| 1 | $1 + \alpha^{12}X$ | | | |
| 2 | | | | |
| 3 | | | | |
| 4 | | | | |
| 5 | | | | |
| 6 | | | | |

Next, the value of $d_\mu$ is calculated for the next row (the row currently being filled in) by applying the following formula:

$$D_\mu = S_{\mu+1} + \sigma_1^{(\mu)}(X) \cdot S_\mu + \sigma_2^{(\mu)}(X) \cdot S_{\mu-1} \ldots + \sigma_{1_{\mu+1}}^{(\mu+1)}(X) \cdot S_{\mu+1-l_{\mu+1}} \quad \text{(EQ. 11)}$$

Wherein $\sigma_a^{(b)}(X)$ is the $a^{th}$ coefficient of $\sigma^{(b)}(X)$ and $1_{\mu+1}=1$. The polynomial $\sigma^{(1)}(X)$ has a degree of 1. Accordingly, for the case in which $\mu=1$, $1_\mu=1$. The other variables of equation EQ. 11 are: $S_{\mu+1}=S_2=1$, $\sigma_1^{(\mu)}(X)=\sigma_1^{(1)}(X)=\alpha^{12}$, $S_\mu=S_1=\alpha^{12}$. It can be seen that $d_\mu$ has only two components, since the degree of $\sigma^\mu(X)$ is one.

Therefore:

$$d_\mu = 1 + \alpha^{12} = 1 + \alpha^{24} = 1 + \alpha^9 - 1\ 0\ 0\ 0\ \oplus 0\ 1\ 0\ 1 = 1\ 1\ 0\ 1 = \alpha^7 \quad \text{(EQ. 12)}$$

The value $\mu-1_\mu=0$ for the $\mu^{th}$ row. Thus, each of the columns of the third row can be completed.

Next, the values of the fourth row are calculated. First, the value of $\sigma^{(\mu+1)}(X)$ is determined, for $\mu=1$. If the value of $d_\mu$ were equal to zero, then the value of $\sigma^{(\mu+1)}(X)$ would be equal to $\sigma^{(\mu)}(X)$. However, since the value of $d_\mu$ is not equal to 0, but rather is equal to $d_1=\alpha^7$, a value must be determined for $\rho$ in order to determine the value of $\sigma^{(\mu+1)}(X)$.

Accordingly, a row must be identified which is prior to the $\mu^{th}$ row and which has both a non-zero value for $d_\mu$ and the greatest value of $\mu-1_\mu$. The value presented in the first column from the left of the identified row is selected as the value for $\rho$. In the present case in which $\mu=1$, the second row (i.e., the row associated with $\mu=0$) is selected, and $\rho$ is set equal to 0. Applying the appropriate formulas, the values shown in the third row are attained in the same manner as was described with respect to the second row.

Next, the values of the fourth row are calculated. The value of $\mu$ is set to 2. Since the value of $d_\mu$ is not zero, a value must be determined for $\rho$. However, at this point in the algorithm, a problem arises in determining the value of $\rho$. That is, the value to be selected for $\rho$ is ambiguous, since there are two rows which each meet the requirements for selection of the value of $\rho$. That is, both the second row ($\mu=0$) and the third row ($\mu=1$) are prior to the $\mu^{th}$ row, have a value of $d_\mu$ which is non-zero, and have values of $\mu-1_\mu$ that are zero, zero being the largest value of any row which occurs prior to the $\mu^{th}$ row. It should be clear that the values associated with the second and third rows are very different and will result in different values for $\sigma^{(\mu+1)}(X)$. In fact, if the wrong value is selected for $\rho$, the error location polynomial that results cannot be used to accurately determine the location of errors in the receive polynomial.

Other such conditions which result in an ambiguity as to the value of $\rho$ arise which make it impossible for errors to be located and corrected. These ambiguities must be resolved in a manner which ensures that the proper value is selected for $\rho$, and thus that the proper row is selected when determining the value of $\sigma^{(\mu+1)}(X)$ by applying equation EQ. 8 above. However, Lin and Costello do not provide any mechanism for resolving this ambiguity. Therefore, it is assumed that the particular row to be used is either selected arbitrarily or that the first row that satisfies the Lin and Costello criteria is selected.

Accordingly, it would be desirable to provide a method and apparatus which allows accurate selection of the value of $\rho$ in cases in which more than one row are equally qualified to be selected as the row to be used in calculating the values of additional entries in table, and thus yielding an error location polynomial that can be used to locate and correct t−1 errors effectively in an RS(n, k) code in which n−k=2t.

SUMMARY OF THE INVENTION

The present invention is a method and apparatus for correcting errors in a receive vector, and a receiver, such as a wireless telephone, modem, base station, or other such device which receives signals and includes such an apparatus for correcting errors. In accordance with one embodiment of the present invention, essentially conventional methods and apparatus are used to produce a polynomial representation of the receive vector, syndromes associated with the receive vector, and a Galios Field table which cross-references symbols in the Galios Field in polynomial representation to symbols in n-tuple representation. An inventive method and apparatus is used to generate an error location polynomial table and thus an error location polynomial which can then be used to locate a greater number of errors in the receive vector and in the case of the preferred embodiment, correct a maximum number of errors in the receive vector. In accordance with the present invention, the number of errors that can be corrected is increased by resolving ambiguities as to the value of $\rho$, where $\rho$ indicates a previous row of the error location polynomial table to be used to generate a next row of the error location polynomial table.

In accordance with the present invention, the inventive method includes comparing previously generated entries into an error location polynomial table to one another to determine which of the previously generated entries should be used in generating a next entry to the table. The inventive method is preferably performed by an inventive apparatus which implements the method using an electronic circuit, such as a processing device, which may be a personal computer, microprocessor, state machine, application specific integrated circuit, or discrete logic circuit. The electronic circuit performs the task of comparing previously generated entries into one another to determine which previously generated entries are to be used to generate a next entry into the error location polynomial table. The electronic circuit then generates the next entry.

In accordance with one embodiment of the present invention, the electronic circuit may comprise several discrete circuits. That is, the tasks which comprise the inventive method may be performed by a distributed processing device or system, such that discrete tasks which make up the method are performed by discrete components. For example, a conventional microprocessor may be used to perform certain tasks, such as determining which previously generated entries into the error location polynomial table should be used to generate the next entry to the error location polynomial table. However, the process of generating the next entry may be performed by a dedicated circuit, such as a state machine in order to make the operation faster and more efficient. The particular manner in which the tasks are divided between components of such a distributed processing device or system is implementation dependent. Accordingly, any task may be performed by any component of the system depending upon the speed at which the system is required to operate and the cost of the system.

In accordance with the inventive method, a prospective row is selected by the conventional Berlekamp iterative algorithm. However, if there is any ambiguity in the selection (i.e., more than one candidate row is determined to be equally qualified), one of the candidates which have been identified by the Berlekamp algorithm and which have not been used to generate a previous row is arbitrarily selected as the prospective row. The value $\mu-1_\mu$ in the prospective row is then compared with the value $\rho-1_\mu$; where $\rho=\mu$ of the row used to generate the last row of the error location polynomial table. Depending upon the result of this comparison, either the prospective row is rejected, or a second comparison is made between $\mu-1_\mu$ and $\rho-1_\rho$ to determine whether these values are equal. Depending upon the result of this comparison, either the value of $1_\mu$ is compared to zero to determine whether the prospective row should be used or not, or the value of $\mu-1_\mu$ is compared to a predetermined value, which is preferably equal to the value t; where t=(n-k)/2), n is the number of symbols in the finite field, and k is the number of information symbols. The result of this comparison then leads to either one or two more comparisons, the results of which are used to determine whether the prospective row is to be used or rejected.

Once a prospective row has been rejected, if the only remaining candidate row is the previously used row, then that row is used. Otherwise, a next candidate is selected as the prospective row and compared to the previously used row, until either the prospective row is accepted or the only remaining candidate row is the previously used row.

BRIEF DESCRIPTION OF THE DRAWINGS

The objects, advantages, and features of this invention will become readily apparent in view of the following description, when read in conjunction with the accompanying drawings, in which.

Like reference numbers and designations in the various drawings refer to like elements.

DESCRIPTION OF THE PREFERRED EMBODIMENTS

Throughout this description, the preferred embodiments should be considered as exemplars, rather than limitations on the present invention.

Preferred embodiments of the present invention include a method and apparatus for detecting and correcting errors which occur in data and a receiver including such an apparatus. A method and apparatus for generating an error location polynomial table for decoding Reed-Solomon symbols to locate and correct errors are at the heart of the embodiments of the present invention.

Figure 1:
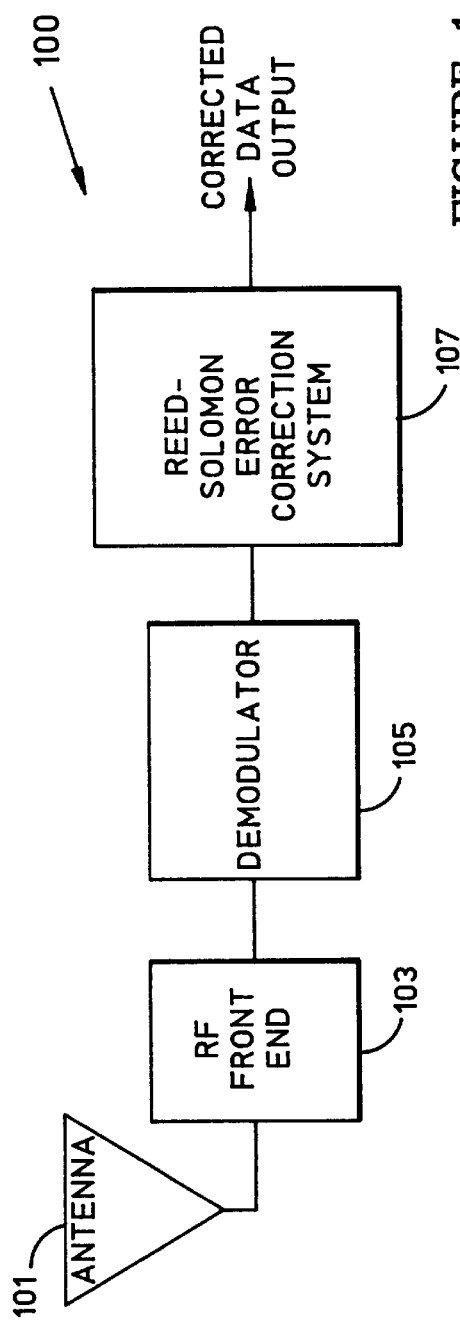
FIG. 1 is a block diagram of a receiver including the present invention.

FIG. 1 is a block diagram of a receiver 100 in accordance with the present invention. Signals are received through an antenna 101 and coupled to a radio frequency (RF) front end 103. These received signals include a signal transmitted using an RF carrier modulated with digital information. For example, the signal transmitted using a modulated RF carrier may be a Cellular Digital Packet Data (CDPD) signal transmitted from a base station to a mobile end user device, such as a CDPD telephone or modem. The front end 103 amplifies the received signals and provides filtering and other signal conditioning to allow information which has been modulated onto the transmit carrier by the transmitter to be recovered by the receiver.

The signal is then coupled from the front end 103 to a demodulator 105. The demodulator 105 demodulates the received signal to recover the information that was modulated onto the transmit carrier by the transmitter. In accordance with the present invention, the information is digitally encoded in accordance with a Reed-Solomon encoding technique. In one embodiment of the present invention, the receiver is designed to receive information that has been encoded using RS (63, 47). Accordingly, the information is encoded in blocks of 63 Reed-Solomon symbols, each symbol being 6 bits in length. Forty-seven of the 63 symbols are used to encode information. The remaining 16 symbols are parity symbols. The output from the demodulator 105 is a digital string of bits, referred to as a receive vector, that is coupled to a Reed-Solomon error correction system 107. The Reed-Solomon error correction system 107 processes the receive vector and outputs a corrected receive vector. The corrected receive vector can then be coupled to a device which interprets a message carried by the receive vector.

Figure 2:
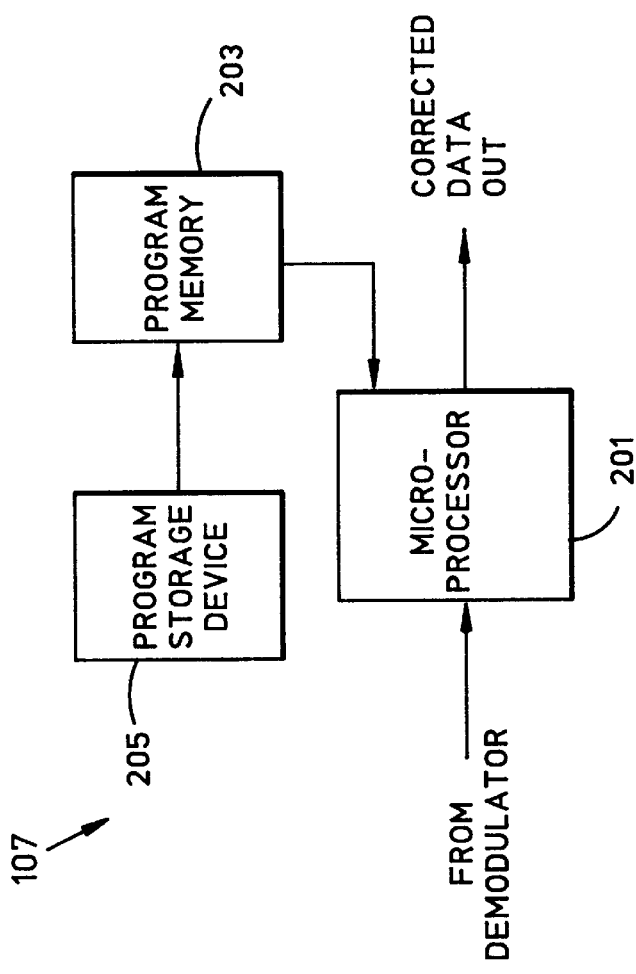
FIG. 2 is a block diagram of a Reed-Solomon error correction system in accordance with the present invention.

FIG. 2 is an illustration of the components of a Reed-Solomon error correction system 107 in accordance with one embodiment of the present invention. As shown in FIG. 2, the Reed-Solomon error correction system 107 comprises a microprocessor 201 which receives the receive vector from the demodulator 105. In accordance with one embodiment of the present invention, a buffer (not shown) may be provided between the demodulator 105 and the microprocessor 201 to allow the receive vector to be processed by the microprocessor 201 at a rate that differs from the rate at which the demodulator 105 demodulates the receive vector. The microprocessor 201 is preferably coupled to a program memory device 203, such as random access memory (RAM) from which the microprocessor 201 receives instructions to be executed in performing the Reed-Solomon error correction functions. Instructions which allow the microprocessor 201 to perform other functions may also be stored within the Program Memory 203, as well as data which the microprocessor 201 uses during operations.

In accordance with one embodiment of the present invention, the program that is stored within the Program Memory 203 may be loaded from a program storage device 205, such as Read-Only Memory (ROM), a floppy disk drive and associated floppy disk, compact disc player and associated compact disc, or other such storage device on which the program to be executed by the microprocessor 201 may be stored. Use of a removable medium program storage device allows the user to update the program easily.

However, in the preferred embodiment of the present invention, the program is stored within the program memory 203, which is, for example, a fixed non-volatile program storage device, such as a ROM provided on an integrated circuit which may or may not be provided as an integral part of the microprocessor 201. In either case, the present invention is a computer program which imparts functionality when encoded on a computer readable medium, such as the removable medium or the fixed non-volatile program storage device.

Figure 3:
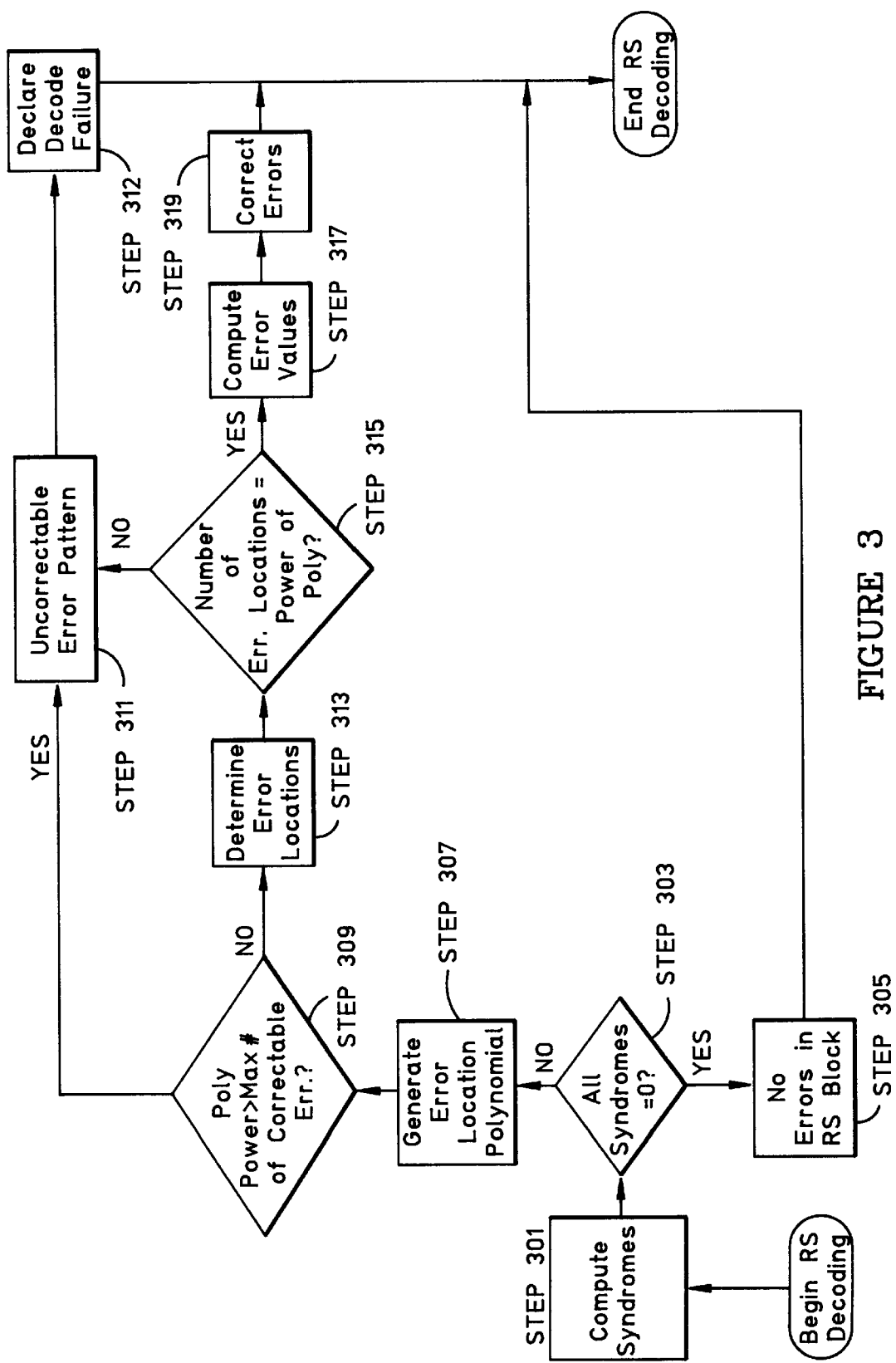
FIG. 3 is a flow chart of the steps performed in decoding Reed-Solomon symbols in accordance with present invention.

FIG. 3 is a flow chart of the steps performed in decoding Reed-Solomon symbols which comprise a Reed-Solomon block of a receive vector, in accordance with present invention. When a block of Reed-Solomon encoded data is coupled from the demodulator 105 to the Reed-Solomon error correction system 107, the first step performed by the inventive system (STEP 301) is to compute syndromes for that block of data, as is well known in the art. If all of the syndromes are equal to zero (STEP 303), then there are no errors in the received block (STEP 305) and the receive block is output without changes.

If however, any of the syndromes has a non-zero value, then there is at least one error in the received Reed-Solomon block. Therefore, an error location polynomial table must be generated (STEP 307). As a consequence of generating the error location polynomial table, an error location polynomial is established. Next, a determination is made as to whether the degree of the error location polynomial is greater than the maximum number of correctable errors (STEP 309). If the degree of the error location polynomial is greater than the maximum number of correctable errors, then the block represents an uncorrectable error pattern (STEP 311) and a failure is declared (STEP 312). If the degree of the error location polynomial is not greater than the maximum number of correctable errors, then the error locations are determined (STEP 313) by identifying the roots of the error location polynomial. Once the locations of the errors have been determined, the number of error locations is compared to the degree of the error location polynomial to verify that the block is correctable (STEP 315). If the number of error locations is not equal to the degree of the error location polynomial, then the block is considered to be uncorrectable (STEP 311) and a failure is declared (STEP 312). However, if the block is correctable, then the error values are computed (STEP 317) and the errors are corrected (STEP 319). The corrected block is then output from the Reed-Solomon error correction system 107.

Each of the steps of the inventive Reed-Solomon error correction process is performed essentially the same way as would be done in a conventional Reed-Solomon error correction system, with the exception of STEP 307. The present invention requires that steps be taken in the generation of the error location polynomial table in addition to those that are conventionally taken to generate the error location polynomial table. These additional steps maximize the number of errors that can be effectively corrected by the Reed-Solomon error correction system 107.

Figure 4A:
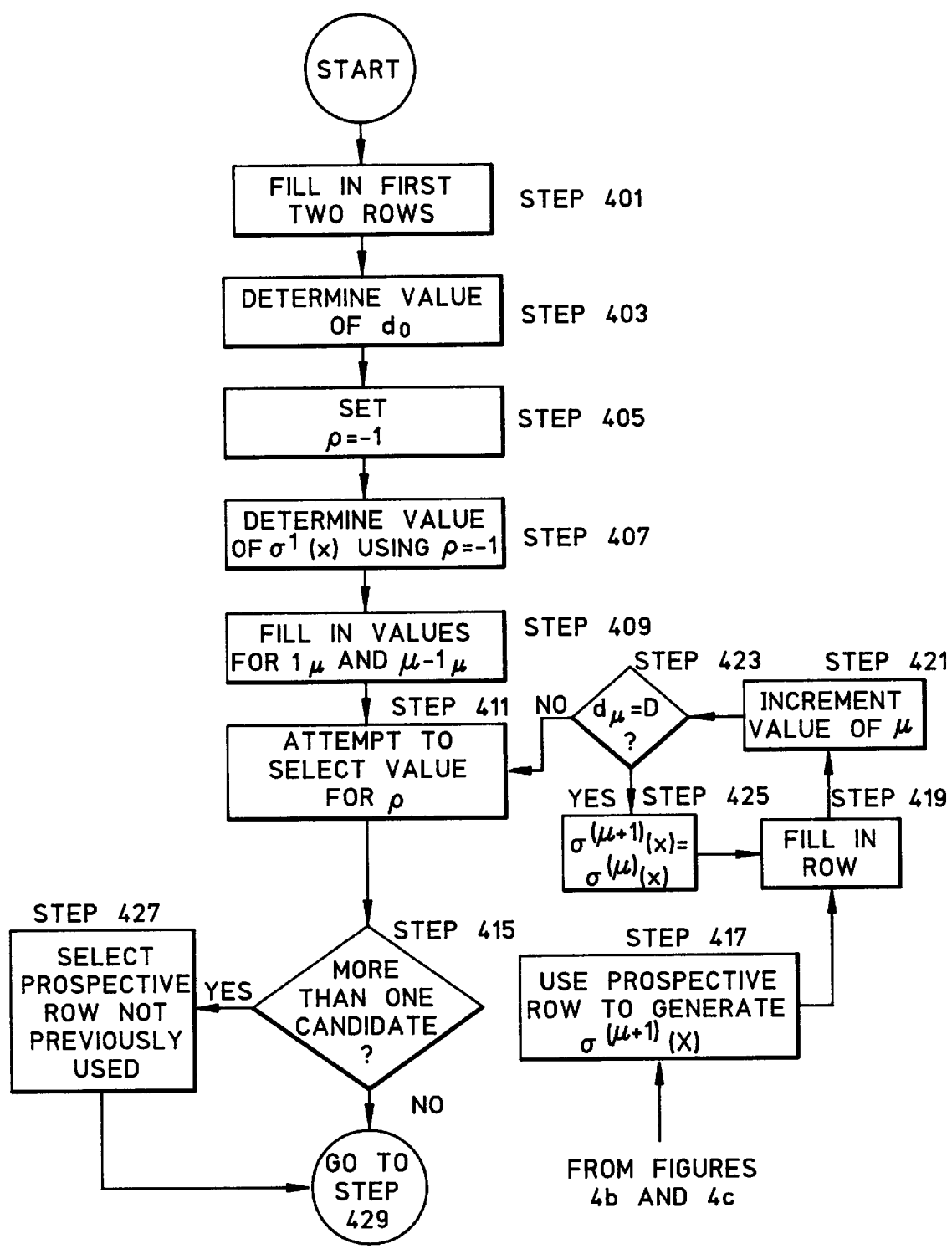
FIG. 4a, 4b, and 4c taken together are a flow chart of the inventive method used by a Reed-Solomon error correction system to determine which row of an error location polynomial table is to be used in generating a next row of the error location polynomial table.
Figure 4B:
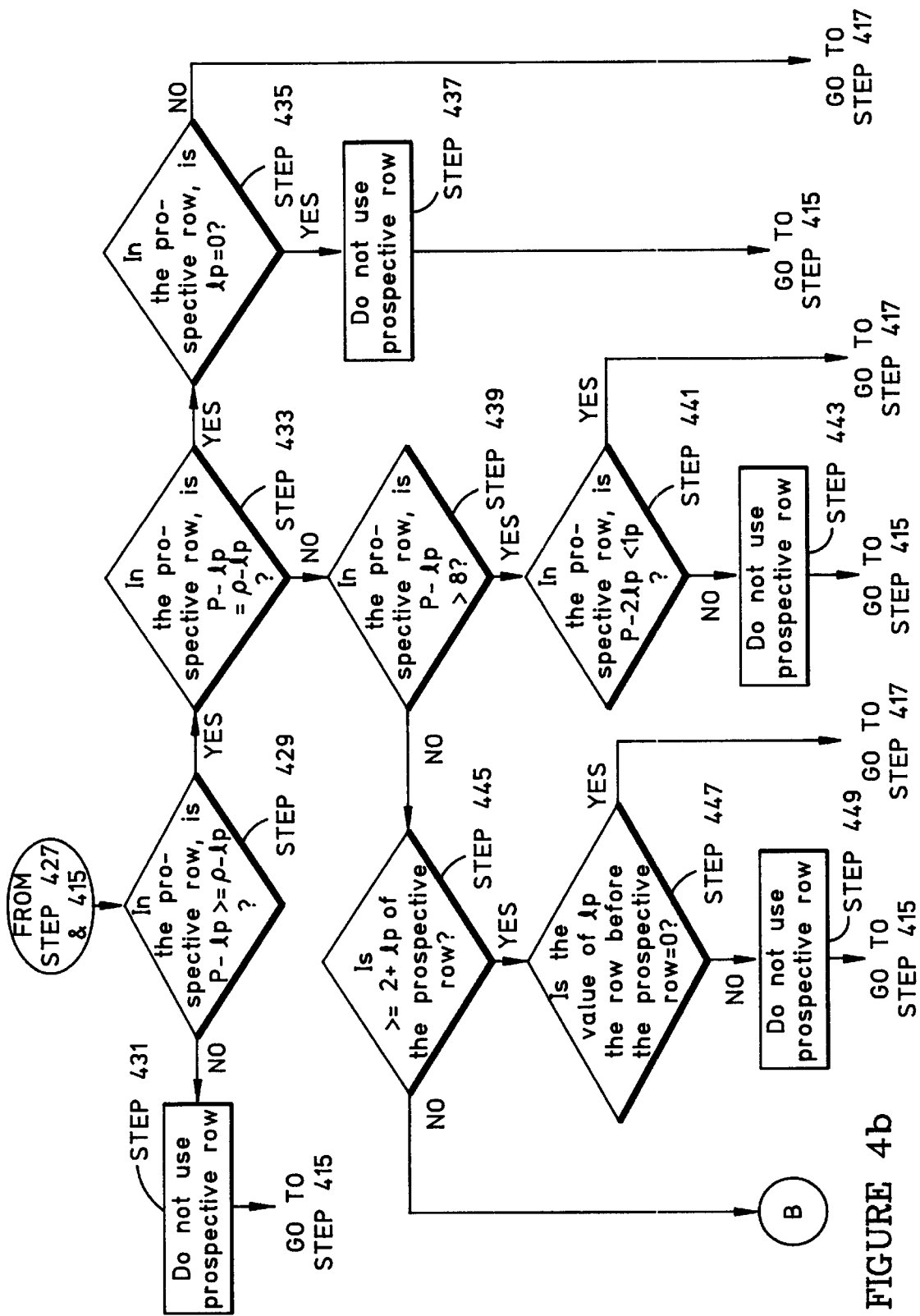
Figure 4C:
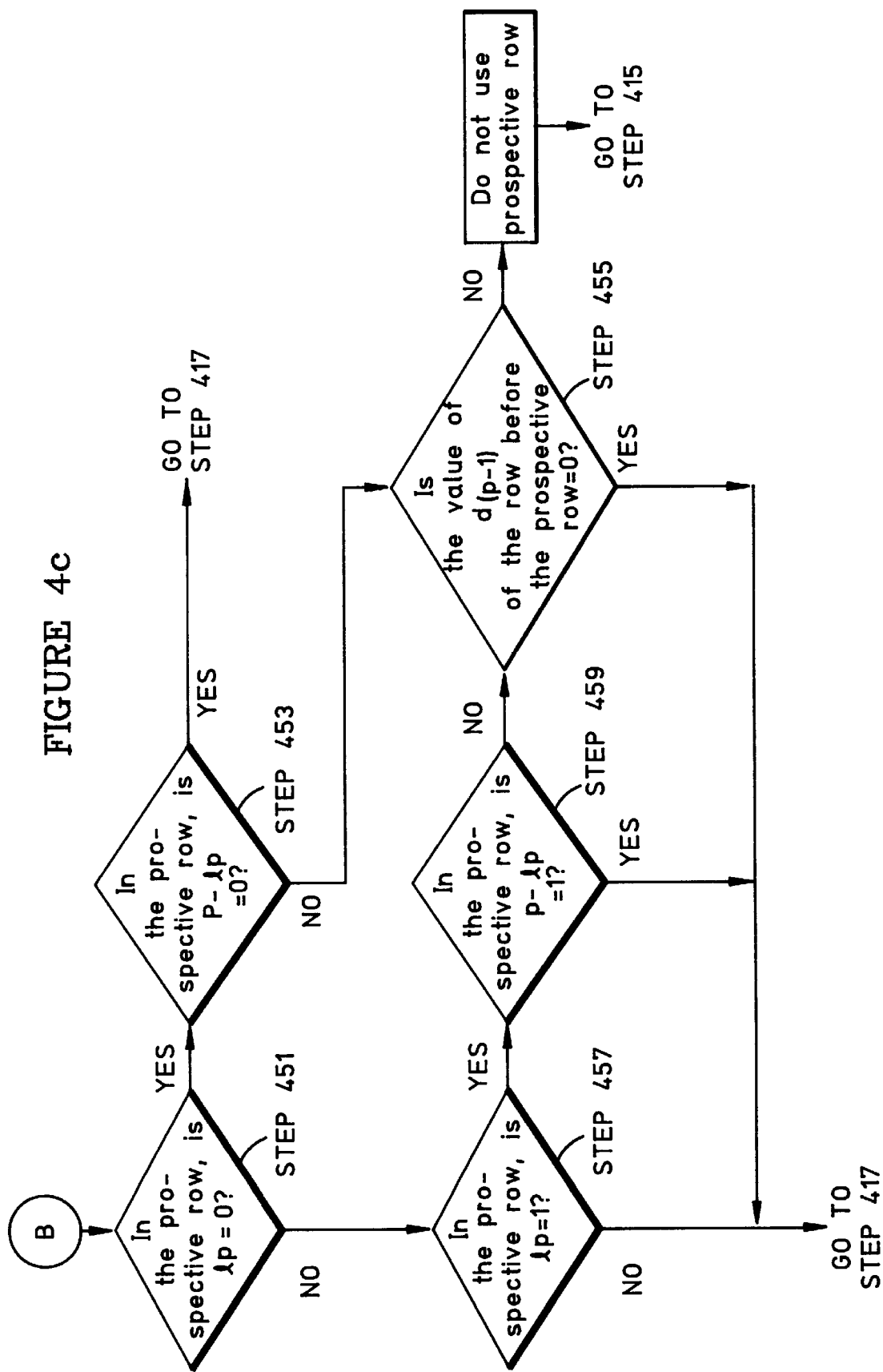

FIG. 4 is a flowchart which illustrates the process performed by the inventive Reed-Solomon error correction system 107 in generating an error location polynomial table. For the sake of clarity, the inventive method and apparatus will be described in the context of an example. Furthermore, for the sake of efficiency, the example which was presented above with respect to Table 1 will be used to describe the present invention. It can be seen that the inventive process proceeds in the same way as the conventional process until an ambiguity arises in selecting a value for ρ when applying equation EQ. 8 to determine the value of $\sigma^{(\mu+1)}(X)$. For convenience, Table 1 has been reproduced and renumbered as Table 5.

TABLE 5

| $\mu$ | $\sigma^{(\mu)}(X)$ | $d_\mu$ | $l_\mu$ | $\mu - l_\mu$ |
| --- | --- | --- | --- | --- |
| −1 | 1 | 1 | 0 | −1 |
| 0 | 1 | $\alpha^{12}$ | 0 | 0 |
| 1 | $1 + \alpha^{12}X$ | $\alpha^7$ | 1 | 0 (take ρ = −1) |
| 2 | $1 + \alpha^3 X$ | 1 | 1 | 1 (take ρ = 0) |
| 3 | $1 + \alpha^3 X + \alpha^3 X^2$ | $\alpha^7$ | 2 | 1 (take ρ = 0) |
| 4 | $1 + \alpha^4 X + \alpha^{12} X^2$ | $\alpha^{10}$ | 2 | 2 (take ρ = 2) |
| 5 | $1 + \alpha^7 X + \alpha^4 X^2 + \alpha^6 X^3$ | 0 | 3 | 2 (take ρ = 3) |
| 6 | $1 + \alpha^7 X + \alpha^4 X^2 + \alpha^6 X^3$ | — | — | — |

Initially, a predetermined number of rows are filled in with known values. In the present example, the first two rows (i.e., $\mu=-1$, and $\mu=0$) are filled in with standard initial values, with the exception of $d_0$, which must be computed for the particular receive vector which is to be processed (STEP 401). In the present example, the receive vector is r=(0 0 0 $\alpha^7$ 0 0 $\alpha^3$ 0 0 0 0 $\alpha^4$ 0 0). The polynomial representation of this receive vector is $r(X)=\alpha^7 X^3 + \alpha^3 X^6 + \alpha^4 X^{12}$. The value of $d_0$ can be determined based upon the value of the receive vector (STEP 403). The value of $d_0$ is equal to $\alpha^{12}$, as can be verified by reviewing the description provided above with respect to Table 1. Additionally, since the value of $d_0$ is not equal to zero, ρ is set to −1 (STEP 405), since the $-1^{th}$ row is the only row present before the $0^{th}$ row, and further in view of the fact that the value $d_{-1}=1$ (i.e., the value $d_{-1}$ is an initial value that is set for all cases). Based upon these values, the value for $\sigma^{(\mu+1)}(X)=\sigma^{(1)}(X)$ can be generated (STEP 407) by applying equation EQ. 8:

$$\sigma^{(\mu+1)}(X) = \sigma^{(1)}(X) \qquad \text{EQ. 13}$$
$$= \sigma^{(\mu)}(X) + (d_\mu / d_\rho) \cdot X^{(\mu-\rho)} \cdot \sigma^{(\mu)}(X)$$
$$= \sigma^{(0)}(X) + (d_0 / d_{-1}) \cdot X^{(0-(-1))} \cdot \sigma^{(0)}(X)$$
$$= 1 + (\alpha^{12} / 1) \cdot X \cdot 1$$
$$= \sigma^{(1)}(X)$$
$$= 1 + \alpha^{12} X$$

Having determined the value of $\sigma^{(1)}(X)$, the value of $l_1$ in the second column from the right and the value $1+l_1$ in the first column from the right in the third row can be determined (STEP 409), since the value $l_1$ is defined as the degree of $\sigma^{(1)}(X)$ (i.e., the largest power to which X has been raised). Next, the value of $d_\mu$ is determined for the $\mu=1$ row (i.e., $d_1$ in the third row) (STEP 411). As shown in the discussion provided with respect to Table 1, the value for $d_1$ is $\alpha^7$. Next, the value for $\sigma^{(\mu+1)}(X)=\sigma^{(2)}(X)$ is determined.

Since the value $d_1$ is not equal to zero, the value of $\sigma^{(2)}(X)$ is determined by applying equation EQ. 8, wherein $\mu=1$. Accordingly, a value must be determined for ρ (STEP 413). When $\mu=1$, there are two rows that precede the $\mu_{th}$ row. That is, the first row in which $\mu=-1$ and the second row in which $\mu=0$ both precede the row in which $\mu=1$. For the value of ρ that will be selected, $d_\rho$ must not be equal to zero, and the first column from the right in the $\rho^{th}$ row must be greater than the value in the first column from the right of each other row which precedes the $\mu^{th}$ row. It can be seen from Table 5, that in the case of $\mu=1$, these conditions are not met for the $\rho=-1$, but are met for $\rho=0$.

If only one row meets these conditions (STEP 415), as is the case in the example shown in Table 5 for $\mu=1$, then the row that meets these conditions is the prospective row and the process continues at STEP 429.

However, if these conditions are met by two or more "candidate" rows (STEP 415) (i.e., the values $d_\mu$ are not zero in two or more rows and the value in the first column from the right of each such row are equal and are also greater than any other value in the first column from the right prior to the $\mu^{th}$ row), then one of the candidate rows which has not previously been used to generate a value for $\sigma^{(\mu+1)}(X)$ is selected as a "prospective" row (STEP 427). The steps that are performed in this case are detailed further below when, in the present example, the condition of STEP 415 is met.

It can be seen that in the present example, when $\mu=2$, there are two candidate rows which each satisfy the conditions for determining the value of $\rho$. That is, the values of $d_\mu$ for both the row in which $\mu=0$ and the row in which $\mu=1$ have non-zero values, and the value in the first column from the right in each of these rows is equal. In order to determine which of these candidate rows should be used to generate the value of $\sigma^{(\mu+1)}(X)$ (i.e., in order to determine the value of $\rho$) a prospective value is selected for $\rho$, the prospective value being one of the candidate values which has not been previously used to generate the value of $\sigma^{(\mu+1)}(X)$ for any other row (STEP 427). In the present example in which $\mu=2$, the second row (i.e., the row in which $\mu=0$) has already been used to generate the value of $\sigma^{(2)}(X)$. Therefore, the prospective value for $\rho$ is selected to be $\rho=1$. For the remainder of this discussion, the prospective value for $\rho$ is referred to as "P", the old value $\rho$ used to generate the last value of $\sigma^{(\mu+1)}(X)$ is referred to as "$\rho$", and the designation "$\mu$" is used to refer to the value in the first column from the left of the last completed row.

After selecting a prospective row, the values in the columns of the prospective row are checked in accordance with the following process. First, the value of the first column from the right (P-$1_P$) in the prospective row is compared to the value in the first column from the right ($\rho$-$1_\rho$) in the row used to generate the last value for $\sigma^{(\mu+1)}(X)$ (STEP 429). If the value of the P-$1_P$ is not greater than or equal to the value of $\rho$-$1_\rho$, then the prospective row is rejected (STEP 431). Therefore, a new value is established for P and the rejected prospective row is no longer considered a candidate row. The process returns to STEP 415 to determine whether more than one candidate row still remain. If only one candidate row remains, then that row is selected as the prospective row and the process continues at STEP 429.

On the other hand, if the value of P-$1_P$ is greater than or equal to the value of $\rho$-$1_\rho$, then another determination is made as to whether P-$1_P$ is equal to the value of $\rho$-$1_\rho$ (STEP 433). If equal, then yet another determination is made as to whether the value of $1_P$=0 (STEP 435). If so, then the prospective row is rejected (STEP 437) and the process returns to STEP 415 to determine whether more than one candidate remain. However, if the value of $1_P$ is not equal to zero (STEP 435), then the prospective row is used to generate the value of $\sigma^{(\mu+1)}(X)$ (STEP 417) and the values in the $\mu^{th}$ row are each generated (STEP 419). That is, once the value of $\sigma^{(\mu+1)}(X)$ is known, each of the other values in that same row (i.e., the $(\mu+1)^{th}$ row), can be determined. Once STEP 419 has been performed and the current row has been completed, the value of $\mu$ is incremented by one (STEP 421). Next, a determination is made as to whether the value of $d_\mu$ is equal to zero. If $d_\mu$ is equal to zero, then the value of $\sigma^{(\mu+1)}(X)$ is set equal to the value of air $\sigma^{(\mu)}(X)$ (STEP 425). The rest of the values for each other column in the row can then be determined (STEP 419). If the value of $d_\mu$ is not equal to zero (STEP 423), then the value of $\sigma^{(\mu+1)}$ is generated for the next row by first determining a value for $\rho$ (STEP 411) as described above.

If the value of P-$1_P$ is greater than, but not equal to, the value of $\rho$-$1_\rho$, then another determination is made as to whether P-$1_P$ is greater than a predetermined value (STEP 439). In the preferred embodiment of the present invention, the predetermined value is set equal to the total number of errors that can be theoretically corrected for the particular Reed-Solomon code. In the present example in which an RS(15, 9) code is being used, the number of error that can be theoretically corrected is (15-9)/2=3. Therefore, if the value of P-$1_P$ is greater than 3, then another determination is made as to whether P-$21_P$ is less than $1_\rho$ (STEP 441). If so, then the process proceeds from STEP 417, and the prospective row is used to generate the value $\sigma^{(\mu+1)}(X)$. Otherwise, the prospective row is rejected (STEP 443) and the processor proceeds from STEP 415. If there is only one remaining candidate row, then that row is used in STEP 417. Otherwise, the next candidate row which has not been used before is selected as the next prospective candidate (STEP 427).

If the value P-$1_P$ is not greater than a predetermined value (STEP 439), then a determination is made as to whether $1_\rho$ is greater than or equal to $1_P$+2 (STEP 445). If $1_\rho$ is greater than or equal to $1_P$+2, then a determination is made as to whether $1_{(\rho-1)}$=0 (STEP 447). If $1_{(\rho-1)}$=0, then the process returns to STEP 417 and the prospective row is used to generate $\sigma^{(\mu+1)}(X)$. Accordingly, $\rho$ is set to P. If, however, $1_{(\rho-1)}$ is not equal to zero, then the prospective row is rejected and the process returns to STEP 415. If there is only one remaining candidate row, then that candidate will be the row that was used to generate $\rho^{(\mu)}(X)$ and is used to generate $\sigma^{(\mu+1)}(X)$. Otherwise the process proceeds to STEP 427 as described above.

If $1_\rho$ is not greater than or equal to $1_P$+2 (STEP 445), then a determination is made as to whether $1_P$=0 (STEP 451). If $1_P$=0, then a further determination is made as to whether P-$1_P$=0 (STEP 453). If P-$1_P$=0, then the process returns to STEP 417 and the prospective row is used to generate $\sigma^{(\mu+1)}(X)$. Accordingly, $\rho$ is set to P.

If P-$1_P$ is not equal to zero, then a determination is made as to whether $d_{(P-1)}$=0 (STEP 455). If $d_{(P-1)}$=0, then the process returns to STEP 417 and the prospective row is used to generate $\sigma^{(\mu+1)}(X)$. Accordingly, $\rho$ is set to P. However, if $d_{(P-1)}$ is not equal to zero (STEP 455), then the prospective row is rejected and the process returns to STEP 415.

If $1_P$ is not equal to zero (STEP 451), then a determination is made as to whether $1_P$=1 (STEP 457). If $1_P$ is not equal to 1, then the process returns to STEP 417 and the prospective row is used to generate $\sigma^{(\mu+1)}(X)$. Accordingly, $\rho$ is set to P. On the other hand, if $1_P$=1, then a determination is made as to whether P-$1_P$ is equal to 1 (STEP 459). If $\rho$-$1_\rho \neq 1$, then the process proceeds at STEP 455. Otherwise, the process returns to STEP 417 and the prospective row is used to generate $\sigma^{(\mu+1)}(X)$. Accordingly, $\rho$ is set to P. The process ends when row having a value in the first column from the left $\mu$=t has been completed.

SUMMARY

A number of embodiments of the present invention have been described, including the preferred embodiment of the invention. Nevertheless, it will be understood that various modifications may be made without departing from the spirit and scope of the invention. For example, a subset of the process steps may be performed to allow the number of errors that can be detected to be improved with a minimal additional expenditure of processing resources. Furthermore, the processing device may be dedicated circuitry, a general purpose computer, an application specific integrated circuit, a state machine, or any other device which is capable of performing the steps described herein. Still further, it should be understood that may of the steps that are described herein may be altered to achieve the same result in a different manner. For example, instead of comparing the values in the first column from the right to one another, the degree of the polynomial $\sigma^{(\mu)}(X)$ can be directly compared. Furthermore, methods may be used to determine whether the "Newton's identities" are meet other than determining whether the value of the discrepancies are equal to zero. Accordingly, it is to be understood that the invention is not to be limited by the specific illustrated embodiments, but only by the scope of the appended claims.

What is claimed is:

1. A method for determining which row of an error location polynomial table to use in calculating a subsequent row of the error location polynomial table, including the steps of:

(a) establishing the value of entries into a predetermined number of rows of the table based upon known values;

(b) selecting a previous row, the values of which are to be used to generate a next row in accordance with a Berlekamp algorithm, if only one of the previous rows meets criteria defined by the Berlekamp algorithm; and (c) if more than one row satisfies the criteria for selecting a previous row to be used to generate a next row as defined by the Berlekamp algorithm, then selecting one of the previous rows to be used to generate a next row, based upon a comparison of the values of the entries in each of such previous rows which satisfies the criteria defined by the Berlekamp algorithm.

2. A method for determining which row of an error location polynomial table to use in calculating a subsequent row of the error location polynomial table, including the steps of:

(a) establishing the value of entries into a predetermined number of rows of the table from known values; and (b) determining which row of the table to use in calculating the next row if more than one row satisfies the criteria for selecting a previous row as defined by the Berlekamp algorithm, based upon a determination as to whether the order of a candidate polynomial specified by the Berlekamp algorithm is zero.

3. A method for determining which row of an error location polynomial table to use in calculating the next row of the error location polynomial table to correct errors in information, including the steps of:

(a) establishing the value of entries into a predetermined number of rows of the error location polynomial table from known values; and (b) determining which row of the table to use in calculating the next row of the error location polynomial table, if more than one row satisfies the criteria for selecting a previous row as defined by the Berlekamp algorithm, based upon a determination as to whether the order of a candidate polynomial specified by the Berlekamp algorithm is greater than a predetermined value.

4. The method of claim 3, wherein the error location polynomial table is a Reed-Solomon error location polynomial table used to correct errors in information encoded using RS(n, k) encoding, wherein t=n-k, and wherein the predetermined value is equal to t/2.

5. A method for determining which previously calculated row of information within an error location polynomial table is to be used in calculating a next row of the error location polynomial table, each row of the error location polynomial table including a first element $\mu$, a second element $\sigma^{(\mu)}(X)$, a third element $d_\mu$, a fourth element $1_\mu$, and a fifth element $\mu-1_\mu$, and each such row being identified as a $\mu^{th}$ row, the first row in the table having a value $\mu=-1$, and each subsequent value of $\mu$ being one greater than the value of I in the previous row, including the steps of:

(a) initializing the value of each of the elements in a predetermined number of rows to known values;

(b) selecting the $-1^{th}$ row as a prospective row to be used in calculating the value of the elements in the next row;

(c) calculating the value of the elements in the next row based on the values of the elements in the $-1^{th}$ row;

(d) selecting the $0^{th}$ row as the prospective row to be used in calculating the value of the elements of the next row;

(e) determining whether the value $\mu-1_\mu$ in the prospective row is greater than or equal to the value of $\mu-1_\mu$ in the row used to calculate the last row;

(f) if the value $\mu-1_\mu$ in the prospective row is not greater than or equal to the value of $\mu-1_\mu$ in the row used to calculate the last row, then using the row used to calculate the last row to calculate the values of the elements in the next row; and (g) if the value $\mu-1_\mu$ in the prospective row is greater than or equal to the value of (h) $\mu-1_\mu$ in the previously selected prospective row then:

(1) determining whether the value $\mu-1_\mu$ in the prospective row is equal to the value of $\mu-1_\mu$ in the row used to calculate the last row;

(2) if the value $\mu-1_\mu$ in the prospective row is equal to the value of $\mu-1_\mu$ in the row used to calculate the last row, then:

(i) determining whether the value $1_\mu$ of the prospective row is equal to zero;

(ii) if the value of $1_\mu$ is equal to zero, then using the row used to calculate the last row to calculate the values of the elements of the next row; and (iii) if the value of $1_\mu$ is not equal to zero, then using the prospective row to calculate the values of the elements of the next row; and (3) if the value $\mu-1_\mu$ in the prospective row is not equal to the value of $\mu-1_\mu$ in the row used to calculate the last row, then:

(i) determining whether the value $\mu-1_\mu$ in the prospective row is greater than a predetermined value;

(ii) if the value $\mu-1_\mu$ in the prospective row is greater than the predetermined value, then:

a) determining whether $\mu-21_\mu$ of the prospective row is less than $1\mu$ of the row used to calculate the last row;

b) if $\mu-21_\mu$ of the prospective row is less than $1\mu$ of the row used to calculate the last row, then using the prospective row to calculate the next row; and c) if $\mu-21_\mu$ of the prospective row is not less than $1\mu$ of the row used to calculate the last row, then using the row used to calculate the last row to calculate the next row; and (iii) if the value $\mu-1_\mu$ in the prospective row is not greater than a predetermined value, then:

a) determining whether $1\mu$ of the row used to calculate the last row is greater than, or equal to, 2 plus the $1\mu$ of the prospective row;

b) if $1\mu$ of the row used to calculate the last row is greater than, or equal to, 2 plus the $1\mu$ of the prospective row, then;
  1) determining whether the value of $1\mu$ of the row immediately before the prospective row is equal to zero;
  2) if the value of $1_\mu$ of the row immediately before the prospective row is equal to zero, then using the prospective row to calculate the values of the next row; and
  3) if the value of $1_\mu$ of the row immediately before the prospective row is not equal to zero, then using the row used to calculate the last row to calculate the next row; and
c) if $1\mu$ of the row used to calculate the last row is not greater than, or equal to, 2 plus the $1\mu$ of the prospective row, then:
  1) determining whether the $1_\mu$ in the prospective row is equal to zero;
  2) if the $1_\mu$ in the prospective row is equal to zero, then:
    i) determining whether $\mu-1_\mu$ in the prospective row is equal to zero;
    ii) if $\mu-1_\mu$ in the prospective row is equal to zero, then using the prospective row to calculate the next row; and
    iii) if $\mu-1_\mu$ in the prospective row is not equal to zero, then:
      a) determining whether the value of $d_\mu$ of the row immediately before the prospective row is equal to zero;
      b) if the value of $d_\mu$ of the row immediately before the prospective row is equal to zero, then using the prospective row to calculate the next row; and
      c) if the value of $d_\mu$ of the row immediately before the prospective row is not equal to zero, then using the row used to calculate the last row to calculate the next row; and
  3) if the $1_\mu$ in the prospective row is not equal to zero, then:
    i) determining whether $1_\mu$ in the prospective row is equal to 1;
    ii) if $1_\mu$ in the prospective row is equal to 1, then:
      a) determining whether $\mu-1_\mu$ is equal to 1;
      b) if $\mu-1_\mu$ is equal to 1, then performing the steps of 2.iii.a through 2.iii.c) above; and
      c) if $\mu-1_\mu$ is not equal to 1, then using the prospective row to calculate the next row; and
    iii) if $1_\mu$ in the prospective row is not equal to 1, then using the prospective row to calculate the next row.

6. A method for determining which previously calculated row of information within an error location polynomial table is to be used in calculating a subsequent row of the error location polynomial table, each row of the error location polynomial table including a first element $\mu$, a second element $\sigma^{(\mu)}(X)$, a third element $d_\mu$, a fourth element $1_\mu$, and a fifth element $\mu-1_\mu$, and each such row being identified as a $\mu^{th}$ row, the first row in the table having a value $\mu=-1$, and each subsequent value of $\mu$ being one greater than the value of $\mu$ in the previous row, including the steps of:
  (a) initializing the value of each of the elements in a predetermined number of rows to known values;
  (b) selecting the $-1^{th}$ row as a prospective row to be used in calculating the value of the elements in the next row;
  (c) calculating the value of the elements in the next row based on the values of the elements in the $-1^{th}$ row;
  (d) selecting the $0^{th}$ row as the prospective row to be used in calculating the value of the elements of the next row;
  (e) determining whether the value $\mu-1_\mu$ in the prospective row is greater than the value of $\mu-1_\mu$ in the row used to calculate the last row;
  (f) if the value $\mu-1_\mu$ in the prospective row is not greater than the value of $\mu-1_\mu$ in the row used to calculate the last row, then using the row used to calculate the last row to calculate the values of the elements in the next row; and
  (g) if the value $\mu-1_\mu$ in the prospective row is greater than or equal to the value of $\mu-1_\mu$ in the previously selected prospective row then using the prospective row to calculate the values of the elements in the next row.

7. A method for determining which previously calculated row of information within an error location polynomial table is to be used in calculating a subsequent row of the error location polynomial table, each row of the error location polynomial table including a first element $\mu$, a second element $\sigma^{(\mu)}(X)$, a third element $d_\mu$, a fourth element $1_\mu$, and a fifth element $\mu-1_\mu$, and each such row being identified as a $\mu^{th}$ row, the first row in the table having a value $\mu$ equal to $-1$, and each subsequent value of $\mu$ being one greater than the value of $\mu$ in the previous row, including the steps of:
  (a) initializing the value of each of the elements in a predetermined number of rows to known values;
  (b) selecting the $-1^{th}$ row as a prospective row to be used in calculating the value of the elements in the next row;
  (c) calculating the value of the elements in the next row based on the values of the elements in the $-1^{th}$ row;
  (d) selecting the $0^{th}$ row as the prospective row to be used in calculating the value of the elements of the next row;
  (e) determining whether the value $\mu-1_\mu$ in the prospective row is greater than a predetermined value;
  (f) if the value $\mu-1_\mu$ in the prospective row is greater than a predetermined value, then:
    (1) determining whether $1\mu$ of the row used to calculate the last row is greater than, or equal to, $\mu-21_\mu$ of the prospective row;
    (2) if $\mu-21_\mu$ of the prospective row is less than $1\mu$ of the row used to calculate the last row, then using the prospective row to calculate the next row; and
    (3) if $\mu-21_\mu$ of the prospective row is less than $1\mu$ of the row used to calculate the last row, then using the row used to calculate the last row to calculate the next row; and
  (g) if the value $\mu-1_\mu$ in the prospective row is greater than a predetermined value, then:
    (1) determining whether $1\mu$ of the row used to calculate the last row is greater than, or equal to, 2 plus the $1\mu$ of the prospective row;
    (2) if $1\mu$ of the row used to calculate the last row is greater than, or equal to, 2 plus the $1\mu$ of the prospective row, then;
    (i) determining whether the value of $1_\mu$ of the row immediately before the prospective row is equal to zero;
    (ii) if the value of $1_\mu$ of the row immediately before the prospective row is equal to zero, then using the prospective row to calculate the values of the next row; and
    (iii) if the value of $1_\mu$ of the row immediately before the prospective row is not equal to zero, then using the row used to calculate the last row to calculate the next row; and
    (3) if $1_\mu$ of the row used to calculate the last row is not greater than or equal to two plus the value of $1_\mu$ of the prospective row, then:

(i) determining whether the $1_\mu$ in the prospective row is equal to zero;

(ii) if the $1_\mu$ in the prospective row is equal to zero, then:

a) determining whether $\mu-1_\mu$ in the prospective row is equal to zero;

b) if $\mu-1_\mu$ in the prospective row is equal to zero, then using the prospective row to calculate the next row; and c) if $\mu-1_\mu$ in the prospective row is not equal to zero, then:

1) determining whether the value of $d_\mu$ of the row immediately before the prospective row is equal to zero;

2) if the value of $d_\mu$ of the row immediately before the prospective row is equal to zero, then using the prospective row to calculate the next row; and 3) if the value of $d_\mu$ of the row immediately before the prospective row is not equal to zero, then using the row used to calculate the last row to calculate the next row; and (iii) if the $1_\mu$ in the prospective row is not equal to zero, then:

a) determining whether $1_\mu$ in the prospective row is equal to 1;

b) if $1_\mu$ in the prospective row is equal to 1, then:

1) determining whether $\mu-1_\mu$ is equal to 1;

2) if $\mu-1_\mu$ is equal to 1, then performing the steps of 2.iii.c) above; and 3) if $\mu-1_\mu$ is not equal to 1, then using the prospective row to calculate the next row; and c) if $1_\mu$ in the prospective row is not equal to 1, then using the prospective row to calculate the next row.

8. A receiver for receiving digital information encoded using Reed-Solomon encoding, including:

(a) an antenna;

(b) a front end coupled to the antenna;

(c) a demodulator coupled to the front end; and (d) a Reed Solomon error correction system for:

(1) establishing the value of entries in a predetermined number of rows of an error location polynomial table from known values; and (2) determining which row of the error location polynomial table to use in calculating the next row, if more than one row satisfies the criteria for selecting a previous row as defined by the Berlekamp algorithm, based upon a determination as to whether the order of a candidate polynomial specified by the Berlekamp algorithm is zero.

9. A receiver for receiving digital information encoded using Reed-Solomon encoding, including:

(a) an antenna;

(b) a front end coupled to the antenna;

(c) a demodulator coupled to the front end; and (d) a Reed Solomon error correction system for:

(1) establishing the value of entries in a predetermined number of rows of an error location polynomial table from known values; and (2) determining which row of the error location polynomial table to use in calculating the next row of the error location polynomial table, if more than one row satisfies the criteria for selecting a previous row as defined by the Berlekamp algorithm, based upon a determination as to whether the order of a candidate polynomial within the error location polynomial table specified by the Berlekamp algorithm is greater than a predetermined value.

10. The receiver of claim 9, wherein the error location polynomial table is a Reed-Solomon error location polynomial table used to correct errors in information encoded using RS (n, k) encoding, wherein t=n-k, and wherein the predetermined value is equal to t/2.

11. A receiver for receiving digital information encoded using Reed-Solomon encoding, including:

(a) an antenna;

(b) a front end, coupled to the antenna;

(c) a demodulator coupled to the front end; and (d) an error correction means for:

(e) initializing the value of each of the elements in a predetermined number of rows to known values within an error location polynomial table, the predetermined number of rows to be used in calculating a next row of the error location polynomial table, each row of the error location polynomial table including a first element $\mu$, a second element $\sigma^{(\mu)}(X)$, a third element $d_\mu$, a fourth element $1_\mu$, and a fifth element $\mu-1_\mu$, and each such row being identified as a $\mu^{th}$ row, the first row in the table having a value $\mu=-1$, and each subsequent value of $\mu$ being one greater than the value of $\mu$ in the previous row;

(f) selecting the $-1^{th}$ row as a prospective row to be used in calculating the value of the elements in the next row;

(g) calculating the value of the elements in the next row based on the values of the elements in the $-1^{th}$ row;

(h) selecting the $0^{th}$ row as the prospective row to be used in calculating the value of the elements of the next row;

(i) determining whether the value $\mu-1_\mu$ in the prospective row is greater than or equal to the value of $\mu-1_\mu$ in the row used to calculate the last row;

(j) if the value $\mu-1_\mu$ in the prospective row is not greater than or equal to the value of $\mu-1_\mu$ in the row used to calculate the last row, then using the row used to calculate the last row to calculate the values of the elements in the next row;

(k) if the value $\mu-1_\mu$ in the prospective row is greater than or equal to the value of $\mu-1_\mu$ in the previously selected prospective row then:

(l) determining whether the value $\mu-1_\mu$ in the prospective row is equal to the value of $\mu-1_\mu$ in the row used to calculate the last row;

(2) if the value $\mu-1_\mu$ in the prospective row is equal to the value of $\mu-1_\mu$ in the row used to calculate the last row, then:

(i) determining whether the value $1_\mu$ of the prospective row is equal to zero;

(ii) if the value of $1_\mu$ is equal to zero, then using the row used to calculate the last row to calculate the values of the elements of the next row; and (iii) if the value of $1_\mu$ is not equal to zero, then using the prospective row to calculate the values of the elements of the next row; and (3) if the value $\mu-1_\mu$ in the prospective row is not equal to the value of $\mu-1_\mu$ in the row used to calculate the last row, then:

(i) determining whether the value $\mu-1_\mu$ in the prospective row is greater than a predetermined value;

(ii) if the value $\mu-1_\mu$ in the prospective row is greater than the predetermined value, then:

a) determining whether $\mu-21_\mu$ of the prospective row is less than $1\mu$ of the row used to calculate the last row;

b) if $\mu-21_\mu$ of the prospective row is less than $1\mu$ of the row used to calculate the last row, then using the prospective row to calculate the next row; and c) if $\mu-21_\mu$ of the prospective row is not less than $1\mu$ of the row used to calculate the last row, then using the row used to calculate the last row to calculate the next row; and (iii) if the value $\mu-1_\mu$ in the prospective row is not greater than a predetermined value, then:

a) determining whether $1\mu$ of the row used to calculate the last row is greater than, or equal to, 2 plus the $1\mu$ of the prospective row;

b) if $1\mu$ of the row used to calculate the last row is greater than, or equal to, 2 plus the $1\mu$ of the prospective row, then;

1) determining whether the value of $1_\mu$ of the row immediately before the prospective row is equal to zero;

2) if the value of $1_\mu$ of the row immediately before the prospective row is equal to zero, then using the prospective row to calculate the values of the next row; and 3) if the value of $1_\mu$ of the row immediately before the prospective row is not equal to zero, then using the row used to calculate the last row to calculate the next row; and c) if $1\mu$ of the row used to calculate the last row is not greater than, or equal to, 2 plus the $1\mu$ of the prospective row, then:

1) determining whether the $1_\mu$ in the prospective row is equal to zero;

2) if the $1_\mu$ in the prospective row is equal to zero, then:

i) determining whether $\mu-1_\mu$ in the prospective row is equal to zero;

ii) if $\mu-1_\mu$ in the prospective row is equal to zero, then using the prospective row to calculate the next row; and iii) if $\mu-1_\mu$ in the prospective row is not equal to zero, then:

a) determining whether the value of $d_\mu$ of the row immediately before the prospective row is equal to zero;

b) if the value of $d_\mu$ of the row immediately before the prospective row is equal to zero, then using the prospective row to calculate the next row; and c) if the value of $d_\mu$ of the row immediately before the prospective row is not equal to zero, then using the row used to calculate the last row to calculate the next row;

3) if the $1_\mu$ in the prospective row is not equal to zero, then:

i) determining whether $1_\mu$ in the prospective row is equal to 1;

ii) if $1_\mu$ in the prospective row is equal to 1, then:

a) determining whether $\mu-1_\mu$ is equal to 1;

b) if $\mu-1_\mu$ is equal to 1, then performing the steps of 2.iii.a through 2.iii.c) above; and c) if $\mu-1_\mu$ is not equal to 1, then using the prospective row to calculate the next row; and iii) if $1_\mu$ in the prospective row is not equal to 1, then using the prospective row to calculate the next row.

12. A receiver for receiving digital information encoded using Reed-Solomon encoding, including:

(a) an antenna;

(b) a front end, coupled to the antenna;

(c) a demodulator coupled to the front end; and (d) an error correction means for:

(e) initializing the value of each of the elements in a predetermined number of rows to known values within an error location polynomial table, the predetermined number of rows to be used in calculating a subsequent row of the error location polynomial table, each row of the error location polynomial table including a first element $\mu$, a second element $\sigma^{(\mu)}(X)$, a third element $d_\mu$, a fourth element $1_\mu$, and a fifth element $\mu-1_\mu$, and each such row being identified as a $\mu^{th}$ row, the first row in the table having a value $\mu=-1$, and each subsequent value of $\mu$ being one greater than the value of $\mu$ in the previous row;

(f) selecting the $-1^{th}$ row as a prospective row to be used in calculating the value of the elements in the next row;

(g) calculating the value of the elements in the next row based on the values of the elements in the $-1^{th}$ row;

(h) selecting the $0^{th}$ row as the prospective row to be used in calculating the value of the elements of the next row;

(i) determining whether the value $\mu-1_\mu$ in the prospective row is greater than the value of $\mu-1_\mu$ in the row used to calculate the last row;

(j) if the value $\mu-1_\mu$ in the prospective row is not greater than the value of $\mu-1_\mu$ in the row used to calculate the last row, then using the row used to calculate the last row to calculate the values of the elements in the next row; and (k) if the value $\mu-1_\mu$ in the prospective row is greater than or equal to the value of $\mu-1_\mu$ in the previously selected prospective row then using the prospective row to calculate the values of the elements in the next row.

13. A receiver for receiving digital information encoded using Reed-Solomon encoding, including:

(a) an antenna;

(b) a front end, coupled to the antenna;

(c) a demodulator coupled to the front end; and (d) an error correction means for:

(e) initializing the value of each of the elements in a predetermined number of rows to known values within an error location polynomial table, the predetermined number of rows to be used in calculating a subsequent row of the error location polynomial table, each row of the error location polynomial table including a first element $\mu$, a second element $\sigma^{(\mu)}(X)$, a third element $d_\mu$, a fourth element $1_\mu$, and a fifth element $\mu-1_\mu$, and each such row being identified as a $\mu^{th}$ row, the first row in the table having a value $\mu$ equal to $-1$, and each subsequent value of $\mu$ being one greater than the value of $\mu$ in the previous row;

(f) selecting the $-1^{th}$ row as a prospective row to be used in calculating the value of the elements in the next row;

(g) calculating the value of the elements in the next row based on the values of the elements in the $-1^{th}$ row;

(h) selecting the $0^{th}$ row as the prospective row to be used in calculating the value of the elements of the next row;

(i) determining whether the value $\mu-1_\mu$ in the prospective row is greater than a predetermined value;

(j) if the value $\mu-1_\mu$ in the prospective row is greater than a predetermined value, then:

(1) determining whether $1\mu$ of the row used to calculate the last row is greater than, or equal to, $\mu-21_\mu$ of the prospective row;

(2) if $\mu-21_\mu$ of the prospective row is less than $1\mu$ of the row used to calculate the last row, then using the prospective row to calculate the next row; and (3) if $\mu-21_\mu$ of the prospective row is less than $1\mu$ of the row used to calculate the last row, then using the row used to calculate the last row to calculate the next row; and (k) if the value $\mu-1_\mu$ in the prospective row is greater than a predetermined value, then:

(1) determining whether $1\mu$ of the row used to calculate the last row is greater than, or equal to, 2 plus the $1\mu$ of the prospective row;

(2) if $1\mu$ of the row used to calculate the last row is greater than, or equal to, 2 plus the $1\mu$ of the prospective row, then;

(i) determining whether the value of $1_\mu$ of the row immediately before the prospective row is equal to zero;

(ii) if the value of $1_\mu$ of the row immediately before the prospective row is equal to zero, then using the prospective row to calculate the values of the next row; and (iii) if the value of $1_\mu$ of the row immediately before the prospective row is not equal to zero, then using the row used to calculate the last row to calculate the next row;

(3) if $1_\mu$ of the row used to calculate the last row is not greater than or equal to two plus the value of $1_\mu$ of the prospective row, then:

(i) determining whether the $1_\mu$ in the prospective row is equal to zero;

(ii) if the $1_\mu$ in the prospective row is equal to zero, then:

a) determining whether $\mu-1_\mu$ in the prospective row is equal to zero;

b) if $\mu-1_\mu$ in the prospective row is equal to zero, then using the prospective row to calculate the next row; and c) if $\mu-1_\mu$ in the prospective row is not equal to zero, then:

1) determining whether the value of $d_\mu$ of the row immediately before the prospective row is equal to zero;

2) if the value of $d_\mu$ of the row immediately before the prospective row is equal to zero, then using the prospective row to calculate the next row; and 3) if the value of $d_\mu$ of the row immediately before the prospective row is not equal to zero, then using the row used to calculate the last row to calculate the next row; and (iii) if the $1_\mu$ in the prospective row is not equal to zero, then:

a) determining whether $1_\mu$ in the prospective row is equal to 1;

b) if $1_\mu$ in the prospective row is equal to 1, then:

1) determining whether $\mu-1_\mu$ is equal to 1;

2) if $\mu-1_\mu$ is equal to 1, then performing the steps of 2.iii.c) above; and 3) if $\mu-1_\mu$ is not equal to 1, then using the prospective row to calculate the next row; and c) if $1_\mu$ in the prospective row is not equal to 1, then using the prospective row to calculate the next row.

* * * * *

UNITED STATES PATENT AND TRADEMARK OFFICE
CERTIFICATE OF CORRECTION

PATENT : 5,970,075

DATED : October 19, 1999

INVENTOR(S) : Langford M. Wasada

It is certified that error appears in the above-identified patent and that said Letters Patent is hereby corrected as shown below:

The title page showing the illustrative figure should be deleted to be replaced with the attached title page.

United States Patent [19]

Wasada

[11] Patent Number: 5,970,075
[45] Date of Patent: Oct. 19, 1999

[54] METHOD AND APPARATUS FOR GENERATING AN ERROR LOCATION POLYNOMIAL TABLE

[75] Inventor: Langford M. Wasada, San Diego, Calif.

[73] Assignee: Uniden San Diego Research and Development Center Inc., Calif.

[21] Appl. No.: 08/878,060

[22] Filed: Jun. 18, 1997

[51] Int. Cl.$^6$ ............................................ H03M 13/00
[52] U.S. Cl. .................... 371/37.11; 371/37.4; 371/37.5; 371/37.8; 375/200; 375/232
[58] Field of Search ............................. 371/37.1, 5.1, 371/37.7, 37.4, 37.6, 37.8, 37.08, 37.12, 37.07, 37.11, 2.1, 37.5; 375/232, 350, 200

[56] References Cited

U.S. PATENT DOCUMENTS

| | | | |
|---|---|---|---|
| 4,584,686 | 4/1986 | Fritze | 371/37 |
| 4,644,543 | 2/1987 | Davis, Jr. | 371/37 |
| 4,833,678 | 5/1989 | Cohen | 371/37 |
| 4,843,607 | 6/1989 | Tong | 371/37 |
| 4,873,688 | 10/1989 | Maki et al. | 371/37.1 |
| 4,958,349 | 9/1990 | Tanner et al. | 371/37.1 |
| 5,040,179 | 8/1991 | Chen | 371/37.1 |
| 5,068,857 | 11/1991 | Yoshida | 371/37.7 |
| 5,396,502 | 3/1995 | Owsley et al. | 371/37.1 |
| 5,532,693 | 7/1996 | Winters et al. | 341/51 |
| 5,708,665 | 1/1998 | Luthi et al. | 371/5.1 |

OTHER PUBLICATIONS

Lin et al., *Error Control Coding, Fundamentals and Applications*, pp. 33, 145–146, 155–157, 159–160, 170–176 (Prentice-Hall, 1983).

*Primary Examiner*—Reba I. Elmore
*Assistant Examiner*—McDieunel Marc
*Attorney, Agent, or Firm*—Heller Ehrman White & McAuliffe

[57] ABSTRACT

A method and apparatus which corrects errors in a receive vector and a receiver. An essentially conventional method and apparatus are used to produce a polynomial representation of the receive vector, syndromes associated with the receive vector, and a Galios Field table. An inventive method and apparatus is used to generate an error location polynomial table and thus an error location polynomial which can then be used to locate and correct a maximum number of errors in the receive vector. The inventive method includes comparing previously generated entities in an error location polynomial table to one another to determine which of the previously generated entries should be used in generating a next entry to the error location polynomial table.

13 Claims, 5 Drawing Sheets

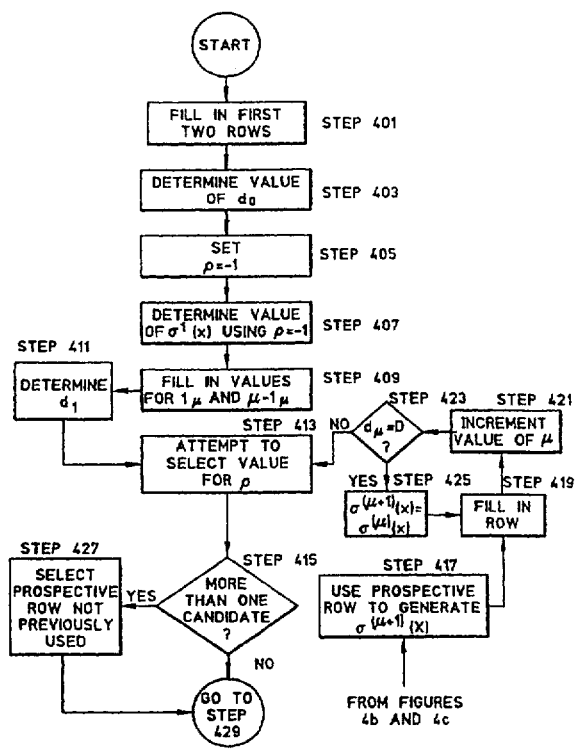

UNITED STATES PATENT AND TRADEMARK OFFICE
CERTIFICATE OF CORRECTION

PATENT NO : 5,970,075
DATED : October 19, 1999
INVENTOR(S) : Wasada

It is certified that error appears in the above-identified patent and that said Letters Patent is hereby corrected as shown below:

at sheet 4, Figure 4b, as shown below in the box labled "Step 439", ">8?" should read —>3?—. In the box labled "Step 445", ">= 2 + lp" should read —lp >= 2 + lp—. In the box labled "Step 441", "<1p" should read —<lp—.

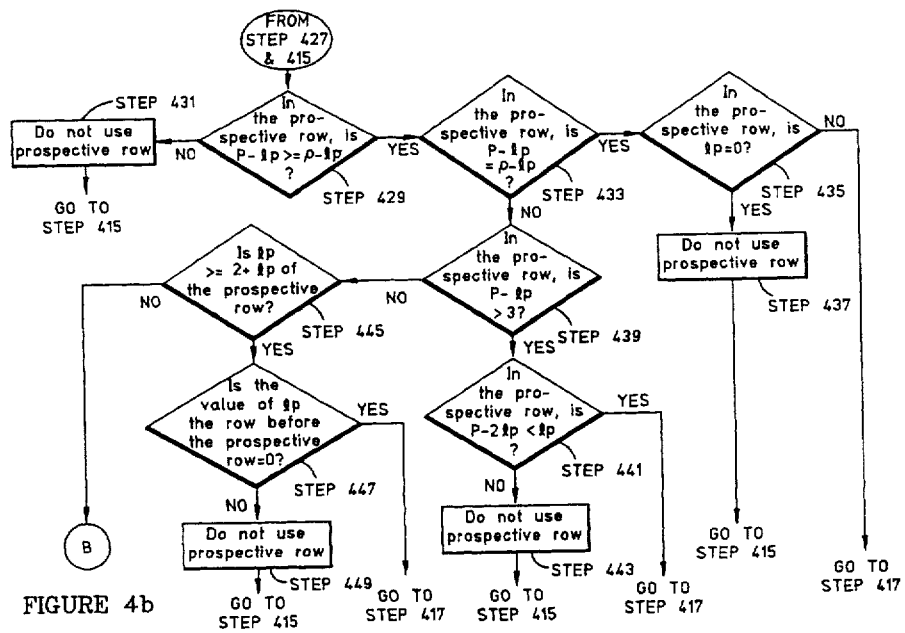

FIGURE 4b

UNITED STATES PATENT AND TRADEMARK OFFICE
CERTIFICATE OF CORRECTION

PATENT NO : 5,970,075
DATED : October 19, 1999
INVENTOR(S) : Wasada

It is certified that error appears in the above-identified patent and that said Letters Patent is hereby corrected as shown below:

IN THE DRAWINGS:

At sheet 3, Figure 4a, as shown below insert box labeled —Step 411— reading as —Determine $d_1$—. The box originally labled "Step 411" should read —Step 413—;

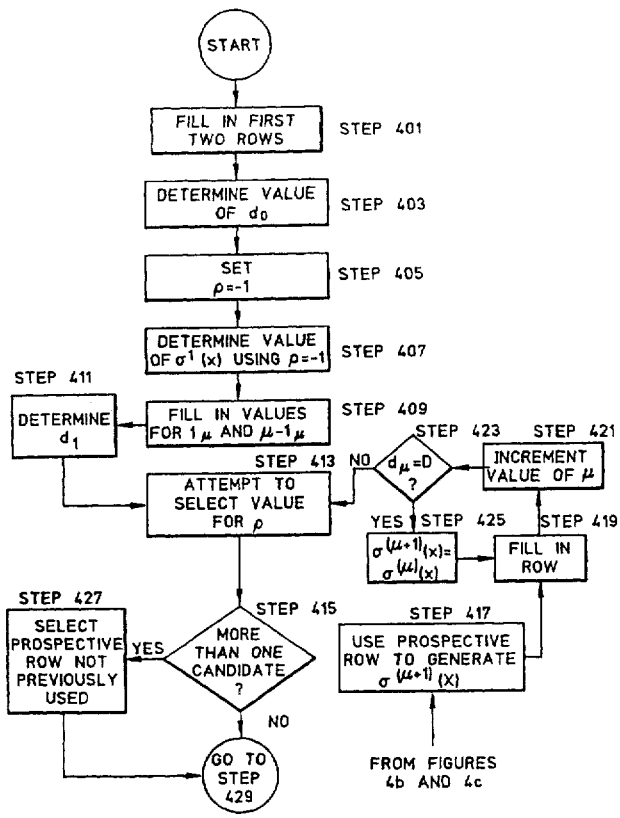

FIGURE 4a

UNITED STATES PATENT AND TRADEMARK OFFICE
CERTIFICATE OF CORRECTION

PATENT NO : 5,970,075

DATED : October 19, 1999

INVENTOR(S) : Wasada

Page 5 of 8

It is certified that error appears in the above-identified patent and that said Letters Patent is hereby corrected as shown below:

IN THE SPECIFICATION:

At column 4, line 64, in equation 10, "$X^{(\mu \cdot p)}$" should read —$X^{(\mu-p)}$—;

at column 5, line 27, equation 11 should read as the following:

—$d_\mu = S_{\mu+1} + \sigma_1^{(\mu)}(X) \cdot S_\mu + \sigma_2^{(\mu)}(X) \cdot S_{\mu-1} \ldots + \sigma_{1\mu+1}^{(\mu+1)}(X) \cdot S_{\mu+1-1\mu+1}$     (EQ. 11)—;

at column 5, line 37, equation 12 should read as the following:

—$d_\mu = 1 + \alpha^{12} \cdot \alpha^{12} = 1 + \alpha^{24} = 1 + \alpha^9 = 1\ 0\ 0\ 0 \oplus 0\ 1\ 0\ 1 = 1\ 1\ 0\ 1 = \alpha^7$     (EQ. 12)—.

IN THE CLAIMS:

Claim 5 should read as the following:

5. A method for determining which previously calculated row of information within an error location polynomial table is to be used in calculating a next row of the error location polynomial table, each row of the error location polynomial table including a first element $\mu$, a second element $\sigma^{(\mu)}(X)$, a third element $d_\mu$, a fourth element $l_\mu$, and a fifth element $\mu - l_\mu$, and each such row being identified as a $\mu^{th}$ row, the first row in the table having a value $\mu = -1$, and each subsequent value of $\mu$ being one greater than the value of $\mu$ in the previous row, including the steps of:

(a) initializing the value of each of the elements in a predetermined number of rows to known values;

(b) selecting the -$1^{th}$ row as a prospective row to be used in calculating the value of the elements in the next row;

(c) calculating the value of the elements in the next row based on the values of the elements in the -$1^{th}$ row;

(d) selecting the $0^{th}$ row as the prospective row to be used in calculating the value of the elements of the next row;

(e) determining whether the value $\mu - l_\mu$ in the prospective row is greater than or equal to the value of $\mu - l_\mu$ in the row used to calculate the last row;

(f) if the value $\mu - l_\mu$ in the prospective row is not greater than or equal to the value of $\mu - l_\mu$ in the row used to calculate the last row, then using the row used to calculate the last row to calculate the values of the elements in the next row; and

UNITED STATES PATENT AND TRADEMARK OFFICE
CERTIFICATE OF CORRECTION

PATENT NO : 5,970,075
DATED : October 19, 1999
INVENTOR(S) : Wasada

It is certified that error appears in the above-identified patent and that said Letters Patent is hereby corrected as shown below:

- (g) if the value $\mu - I_\mu$ in the prospective row is greater than or equal to the value of
- (h) $\mu - I_\mu$ in the previously selected prospective row then:
    - (1) determining whether the value $\mu - I_\mu$ in the prospective row is equal to the value of $\mu - I_\mu$ in the row used to calculate the last row;
    - (2) if the value $\mu - I_\mu$ in the prospective row is equal to the value of $\mu - I_\mu$ in the row used to calculate the last row, then:
        - (i) determining whether the value $I_\mu$ of the prospective row is equal to zero;
        - (ii) if the value of $I_\mu$ is equal to zero, then using the row used to calculate the last row to calculate the values of the elements of the next row; and
        - (iii) if the value of $I_\mu$ is not equal to zero, then using the prospective row to calculate the values of the elements of the next row; and
    - (3) if the value $\mu - I_\mu$ in the prospective row is not equal to the value of $\mu - I_\mu$ in the row used to calculate the last row, then:
        - (i) determining whether the value $\mu - I_\mu$ in the prospective row is greater than a predetermined value;
        - (ii) if the value $\mu - I_\mu$ in the prospective row is greater than the predetermined value, then:
            - a) determining whether $\mu - 2I_\mu$ of the prospective row is less than $I\mu$ of the row used to calculate the last row;
            - b) if $\mu - 2I_\mu$ of the prospective row is less than $I\mu$ of the row used to calculate the last row, then using the prospective row to calculate the next row; and
            - c) if $\mu - 2I_\mu$ of the prospective row is not less than $I\mu$ of the row used to calculate the last row, then using the row used to calculate the last row to calculate the next row; and

UNITED STATES PATENT AND TRADEMARK OFFICE
CERTIFICATE OF CORRECTION

Page 7 of 8

PATENT NO : 5,970,075
DATED : October 19, 1999
INVENTOR(S) : Wasada

It is certified that error appears in the above-identified patent and that said Letters Patent is hereby corrected as shown below:

(iii) if the value $\mu - l_\mu$ in the prospective row is not greater than a predetermined value, then:
  a) determining whether $l\mu$ of the row used to calculate the last row is greater than, or equal to, 2 plus the $l\mu$ of the prospective row;
  b) if $l\mu$ of the row used to calculate the last row is greater than, or equal to, 2 plus the $l\mu$ of the prospective row, then;
   1) determining whether the value of $l_\mu$ of the row immediately before the prospective row is equal to zero;
   2) if the value of $l_\mu$ of the row immediately before the prospective row is equal to zero, then using the prospective row to calculate the values of the next row; and
   3) if the value of $l_\mu$ of the row immediately before the prospective row is not equal to zero, then using the row used to calculate the last row to calculate the next row; and
  c) if $l\mu$ of the row used to calculate the last row is not greater than, or equal to, 2 plus the $l\mu$ of the prospective row, then:
   1) determining whether the $l_\mu$ in the prospective row is equal to zero;
   2) if the $l_\mu$ in the prospective row is equal to zero, then:
    (i) determining whether $\mu - l_\mu$ in the prospective row is equal to zero;
    (ii) if $\mu - l_\mu$ in the prospective row is equal to zero, then using the prospective row to calculate the next row; and
    (iii) if $\mu - l_\mu$ in the prospective row is not equal to zero, then:
     a) determining whether the value of $d_\mu$ of the row immediately before the prospective row is equal to zero;
     b) if the value of $d_\mu$ of the row immediately before the prospective row is equal to zero, then using the prospective row to calculate the next row; and
     c) if the value of $d_\mu$ of the row immediately before the prospective row is not equal to zero, then using the row used to calculate the last row to calculate the next row; and

UNITED STATES PATENT AND TRADEMARK OFFICE
CERTIFICATE OF CORRECTION

PATENT NO : 5,970,075
DATED : October 19, 1999
INVENTOR(S) : Wasada

It is certified that error appears in the above-identified patent and that said Letters Patent is hereby corrected as shown below:

3) if the $l_\mu$ in the prospective row is not equal to zero, then:
     (i) determining whether $l_\mu$ in the prospective row is equal to 1;
     (ii) if $l_\mu$ in the prospective row is equal to 1, then:
       a) determining whether $\mu - l_\mu$ is equal to 1;
       b) if $\mu - l_\mu$ is equal to 1, then performing the steps of 2.iii.a through 2.iii.c) above; and
       c) if $\mu - l_\mu$ is not equal to 1, then using the prospective row to calculate the next row; and
     (iii) if $l_\mu$ in the prospective row is not equal to 1, then using the prospective row to calculate the next row.

Signed and Sealed this

Sixth Day of March, 2001

Attest:

Attesting Officer

NICHOLAS P. GODICI

Acting Director of the United States Patent and Trademark Office